United States Patent
Hand et al.

(10) Patent No.: US 7,729,790 B1
(45) Date of Patent: Jun. 1, 2010

(54) PHASE ALIGNMENT OF AUDIO OUTPUT DATA IN A MULTI-CHANNEL CONFIGURATION

(75) Inventors: Larry E. Hand, Meridian, MS (US); Jack B. Andersen, Cedar Park, TX (US); Daniel L. W. Chieng, Austin, TX (US); Michael A. Kost, Cedar Park, TX (US); Wilson E. Taylor, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 1512 days.

(21) Appl. No.: 10/805,590

(22) Filed: Mar. 19, 2004

Related U.S. Application Data

(60) Provisional application No. 60/469,774, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*G06F 17/00* (2006.01)
*G06F 1/04* (2006.01)
*H03M 7/00* (2006.01)

(52) U.S. Cl. ............................ 700/94; 713/503; 341/61

(58) Field of Classification Search ................. 700/94; 370/503, 504; 369/19; 377/115; 710/58; 713/500, 501, 502, 503; 341/61; 375/371
See application file for complete search history.

(56) References Cited

U.S. PATENT DOCUMENTS

| | | | |
|---|---|---|---|
| 5,390,180 A * | 2/1995 | Reilly | 370/476 |
| 5,778,218 A * | 7/1998 | Gulick | 713/503 |
| 5,918,073 A * | 6/1999 | Hewitt | 710/52 |
| 6,294,954 B1 | 9/2001 | Melonson | |
| 6,389,139 B1 * | 5/2002 | Curtis et al. | 381/105 |
| 6,429,737 B1 * | 8/2002 | O'Brien | 330/10 |
| 6,683,494 B2 * | 1/2004 | Stanley | 330/10 |
| 7,099,426 B1 * | 8/2006 | Cory et al. | 375/372 |
| 7,302,396 B1 * | 11/2007 | Cooke | 704/500 |
| 2002/0122518 A1* | 9/2002 | Yasuda et al. | 375/372 |
| 2003/0042976 A1* | 3/2003 | Midya et al. | 330/10 |

* cited by examiner

*Primary Examiner*—Vivian Chin
*Assistant Examiner*—Daniel R Sellers
(74) *Attorney, Agent, or Firm*—Fliesler Meyer LLP

(57) ABSTRACT

Systems and methods for ensuring proper phase alignment of audio signals which are processed by separate hardware channels in an audio amplification system. In one embodiment, the phase alignment is controlled by determining the number of audio data samples which are stored in the input buffers of multiple audio amplification units and controlling reads from the input buffers to minimize the difference between an actual read-write pointer differential and a target differential. In a master unit, the target differential is a predetermined target value corresponding to a desired delay in the buffer. The actual pointer differential of the master unit is passed to one or more slave units. The actual pointer differential of the master unit is used as the target differential of the slave units. The pointer differentials of the slave units are thereby driven to track the pointer differential of the master unit, keeping the units synchronized.

26 Claims, 5 Drawing Sheets

PHASE ALIGNMENT OF AUDIO OUTPUT DATA IN A MULTI-CHANNEL CONFIGURATION

RELATED APPLICATIONS

This application claims priority to U.S. Provisional Patent Application No. 60/469,774, entitled "Phase Alignment of Output Audio in a Multi-SRC Configuration," by Hand, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to the synchronization of data and more particularly to the synchronization of sampled audio data between multiple channels of an audio amplification system.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

While PWM techniques have advanced and become more widely applicable to various types of systems, they still suffer from a variety of problems. For example, the performance and quality characteristics of Class D amplifiers typically vary with the particular applications in which they are used. The exact implementation of the total system solution and the end-user application is not deterministic, and hence cannot be accounted for apriori. With the existing technologies, designs require point solutions that are not flexible, scalable or transportable across applications.

Further, Class D amplifiers are extremely sensitive to unstable or variable clock domains. The quality and performance of these systems may therefore be much lower than desired when they are used in situations where the integrity, frequency and stability of the digital input signal is unknown. Even in situations where these factors are well-known and were controlled, the clock domain of the amplifier itself must be extremely stable.

As a result of these problems, Class D amplifiers are not easily adaptable to the requirements of many mainstream systems. Consider, for example, a multi-channel audio applications such as a home theater system. Typically, such a system has too many channels to be handled by a single integrated Class D unit, which might have two channels, each capable of handling a stereo pair of signals. It would therefore be necessary to use multiple units. Running multiple units side-by-side requires synchronization and output data phase alignment which is generally beyond the capabilities of most Class D systems. Resulting errors may cause phase mismatches which are audible and which may noticeably degrade the quality of the sound produced by the system.

One prior art system attempts to address the synchronization of multiple channels by sharing sample rate ratio information. In this system, multiple channels process audio data streams. Each of these channels converts data from a received sample rate to a desired output sample rate. The ratio of the output rate to the input rate is computed for one channel and then passed to the other channels. This solution, however, requires quite a bit of overhead in the computation of the ratio and the transmission of the resulting information to the other channels. Further, it does not account for the variations in sample rates from one channel to another.

SUMMARY OF THE INVENTION

One or more of the problems outlined above may be solved by the various embodiments of the invention. Broadly speaking, the invention comprises systems and methods for ensuring proper phase alignment of audio signals which are processed by separate hardware channels in an audio amplification system. The phase alignment is controlled by determining the number of audio data samples which are stored in the input buffers of multiple audio amplification units and controlling reads from the input buffers to minimize the difference between an actual read-write pointer differential and a target differential. In a master unit, the target differential is a predetermined target value corresponding to a desired delay in the buffer. In one or more slave units, the target differential is the actual pointer differential of the master unit. The pointer differentials of the slave units are thereby driven to track the pointer differential of the master unit, keeping the units synchronized.

One embodiment comprises a multi-channel audio amplifier system having a plurality of audio amplifier channels. For the purposes of synchronization, one of the channels is considered a master and the others are considered slaves. Each channel comprises a sample rate converter having an input buffer and a buffer management unit. The sample rate converter is configured to receive samples of an input audio data stream, store the samples in an input buffer, retrieve samples from the input buffer, and convert the samples to a re-sampled audio data stream. The buffer management unit is coupled to the input buffer and configured to maintain read and write pointers for the buffer. The buffer management unit is configured to determine an actual difference between the values of the read and write pointers, and to control reads from the input buffer to achieve a target difference between the values of the read and write pointers. In the master channel, the target difference comprises a predetermined value, while in the slave channels the target difference comprises the actual difference between the values of the read and write pointers in the master channel. The slaves are thereby synchronized to the master.

Another embodiment comprises a method including the steps of determining a difference between values of a read pointer and a write pointer in each of a plurality of buffers, controlling reads from a first one of the buffers to drive the difference between the corresponding read and write pointers to a predetermined value, and controlling reads from each of the remaining buffers to drive the difference between the corresponding read and write pointers to the difference between the read and write pointers of the first buffer. In one embodiment, the method is implemented in a multi-channel audio amplification system. In this embodiment, the buffers are input buffers in sample rate converters for the multiple channels. Audio data samples for the data streams processed by each of the channels are written to the buffer, read out of the buffer, and convolved with sets of polyphase filter coefficients to produce samples of an output audio data stream.

Numerous additional embodiments are also possible.

The various embodiments of the invention may provide a number of benefits over the prior art. For instance, they allow multiple channels to be easily synchronized, minimizing phase alignment errors and enhancing performance. Further, they may enable synchronization while requiring only minimal information to be transmitted between the different sample rate converters. Still further, the same algorithm can be used to implement the pointer differential tracking in each of the sample rate converters (the only difference being the different target differentials for the master and the slaves).

BRIEF DESCRIPTION OF THE DRAWINGS

Other objects and advantages of the invention may become apparent upon reading the following detailed description and upon reference to the accompanying drawings.

Figure 1:
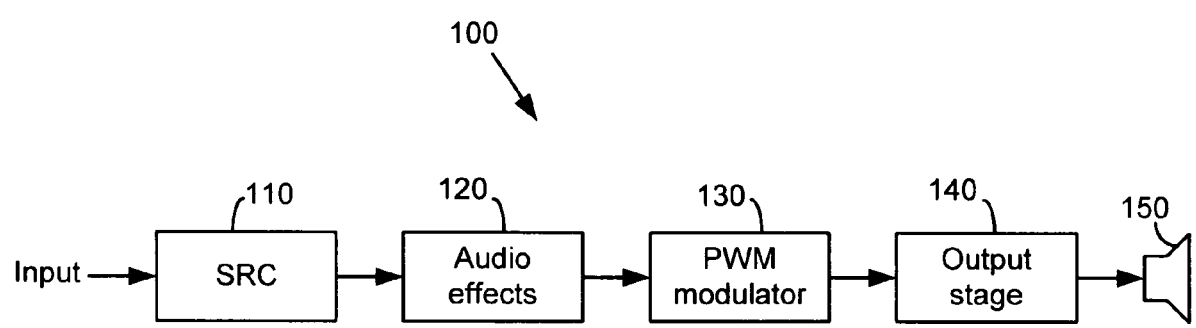
FIG. 1 is a functional block diagram illustrating a digital audio amplification system using pulse width modulation technology.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for ensuring the proper phase alignment of audio signals which are processed by separate hardware channels in an audio amplification system. The phase alignment is controlled by determining the number of audio data samples which are stored in the input buffers of multiple audio amplification units. One of the units is a master, and the rest are slaves. Reads from the input buffer of the master unit are controlled so that the number of samples in the input buffer is driven to a target number. Reads from the input buffers of the slave units are then controlled so that the numbers of samples in their respective input buffers are driven to the actual number of samples in the master unit's input buffer.

In one embodiment, the invention is implemented in a PWM audio amplification system. The system comprises multiple channels, each of which includes a sample rate converter that converts an input data stream having an input sample rate to and output data stream having an output sample rate. The output data stream corresponding to each channel is then processed by an audio effects unit, a PWM modulator and an output stage, and is then transmitted to a speaker which converts it to and audible signal. The alignment of the audio signals of each of the channels is controlled in the respective sample rate converters.

This is accomplished by tracking the values of the read and write pointers for the input buffers of the sample rate converters. The difference between the read pointer and the write pointer is the amount of data (number of samples) in the respective buffer. Samples are read out of the buffer at a controlled rate in order to drive the difference between the pointers (the number of samples in the buffer) to a target value. In one sample rate converter (which is considered the master), the target value is a predetermined value. In the rest of the sample rate converters (which are considered slaves), the target value is the actual difference between the values of the pointers in the master's input buffer. Thus, the master attempts to maintain the predetermined number of samples in its buffer, while the slaves attempt to track the master sample rate converter.

This system may provide a number of benefits over the prior art. For instance, it allows multiple channels to be synchronized, so that phase alignment errors between the channels are minimized and performance is enhanced. Further, it is only necessary to inform the slaves of the pointer differential of the master, so the synchronization information that has to be passed between the different channels is minimized. Still further, the algorithm which is used to implement the pointer tracking and control is essentially the same for each of the sample rate converters, with the only difference being the target value for the pointer differential. The target for the master is a constant (the predetermined value), while the target for each of the slaves is a variable (the actual differential of the master).

A preferred embodiment of the invention is implemented in an audio amplification system. As noted above, pulse width modulation (PWM) technology has recently been applied in audio amplification systems, but has suffered from the drawbacks of conventional methodologies. These methodologies employ analog modulation schemes which are very complex and costly, and which provide relatively poor performance. The present systems and methods are instead implemented in digital modulation schemes and employ methodologies which overcome some of the problems that existed in the prior art.

Referring to FIG. 1, a functional block diagram illustrating a digital audio amplification system using PWM technology is shown. In this embodiment, system 100 receives a digital input data stream from a data source such as a CD player, MP3 player, digital audio tape, or the like. The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 48 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents an amplitude modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker system 150, which converts the electrical signal to an audible signal which can be heard by a listener.

The present disclosure focuses on the sample rate converter in the audio system described above. As explained above, the purpose of the sample rate converter is to receive an input data stream which is sampled at a first rate, and to generate an output data stream which is sampled at a second rate. While the audio signal which is represented by the data stream normally remains unchanged, the sampling rate is changed to conform to the requirements of the audio system so that it can be processed by the system.

Figure 2:
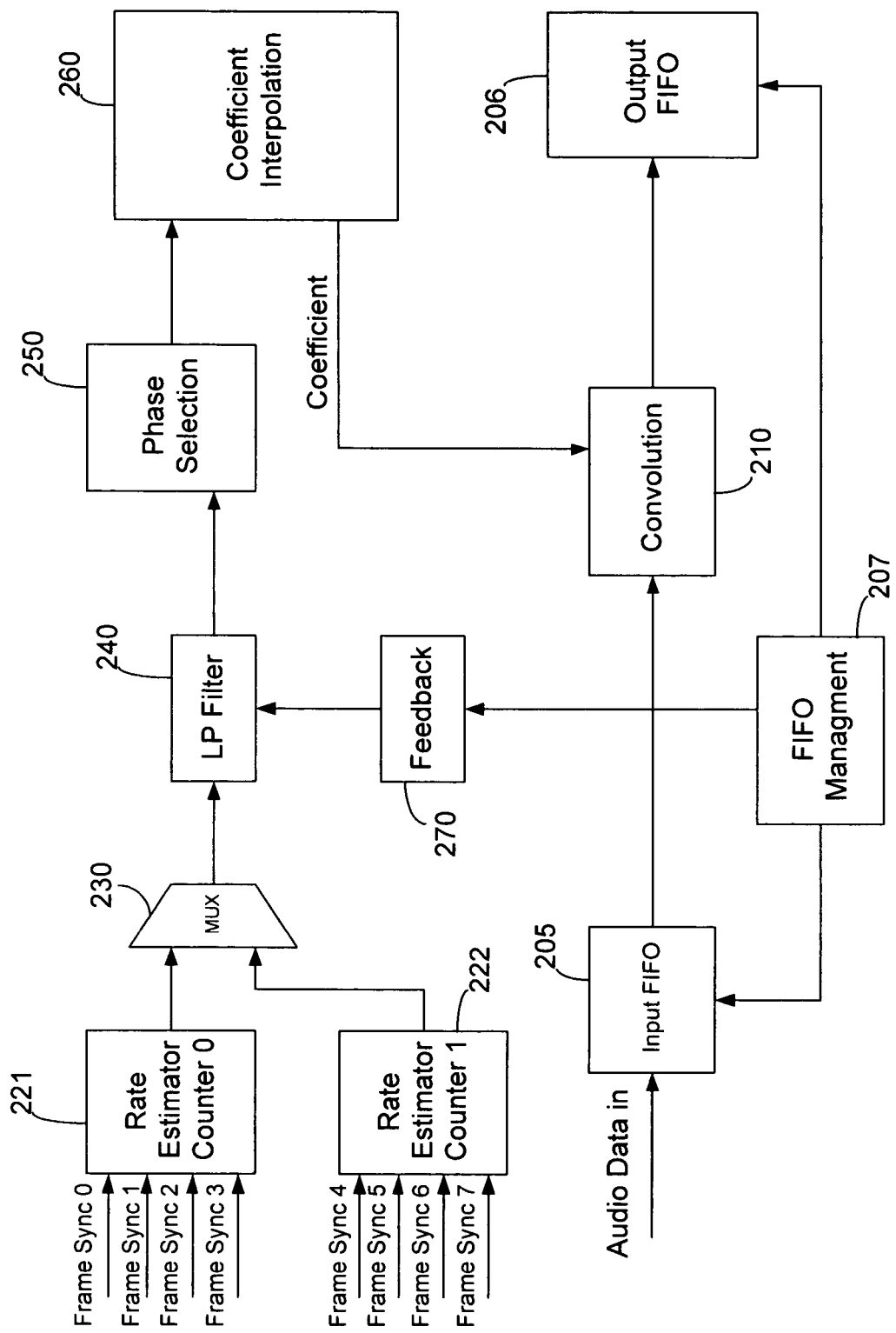
FIG. 2 is a diagram illustrating the components of a sample rate converter in accordance with one embodiment of the invention.

Referring to FIG. 2, a diagram illustrating the components of a sample rate converter in accordance with one embodiment of the invention is shown. The lower half of the figure generally corresponds to a data path for the audio data that will be converted, while the upper half of the figure corresponds to a control path for controlling the actual sample rate conversion.

As shown in FIG. 2, samples of an audio data stream are received and stored in an input FIFO 205. The input data stream has a sample rate of Fin.

The samples are read from FIFO 205 and convolved with a set of interpolated coefficients by convolution engine 210. Convolution engine 210 effectively up-samples or down-samples the data to produce samples at a rate equivalent to the output rate ($F_{out}$) of the sample rate converter. These samples are stored in an output FIFO 206. The samples are then read out of output FIFO 206 at rate $F_{out}$.

Frame sync signals associated with the audio data are received by rate estimator counters 221 and 222. One of the sample rate estimator counters is used to generate a count that corresponds inversely to the input sample rate. This rate is passed through a second order low pass filter 240 with a cutoff frequency in the range of 1 to 100 Hz. The output of this filter is a smoothed version of the estimated input sample rate. This smoothed estimate is forwarded to phase selection unit 250, which is implemented in software in a digital signal processor (DSP). The DSP converts the smoothed estimate to a phase increment input to a phase accumulator, which is used to interpolate the filter coefficients for the polyphase filter. The interpolated polyphase filter coefficients are then convolved with the data samples in convolution unit 210 to produce the re-sampled data.

The output of the phase accumulator also drives the read pointer for the input buffer (which is a first-in-first-out, or FIFO buffer) through buffer management unit 207. Data is written to input buffer 205 sequentially and read from the buffer with a fractional offset and passed through low pass polyphase filter (i.e., it is convolved with the filter coefficients in convolution unit 210.

Figure 3:
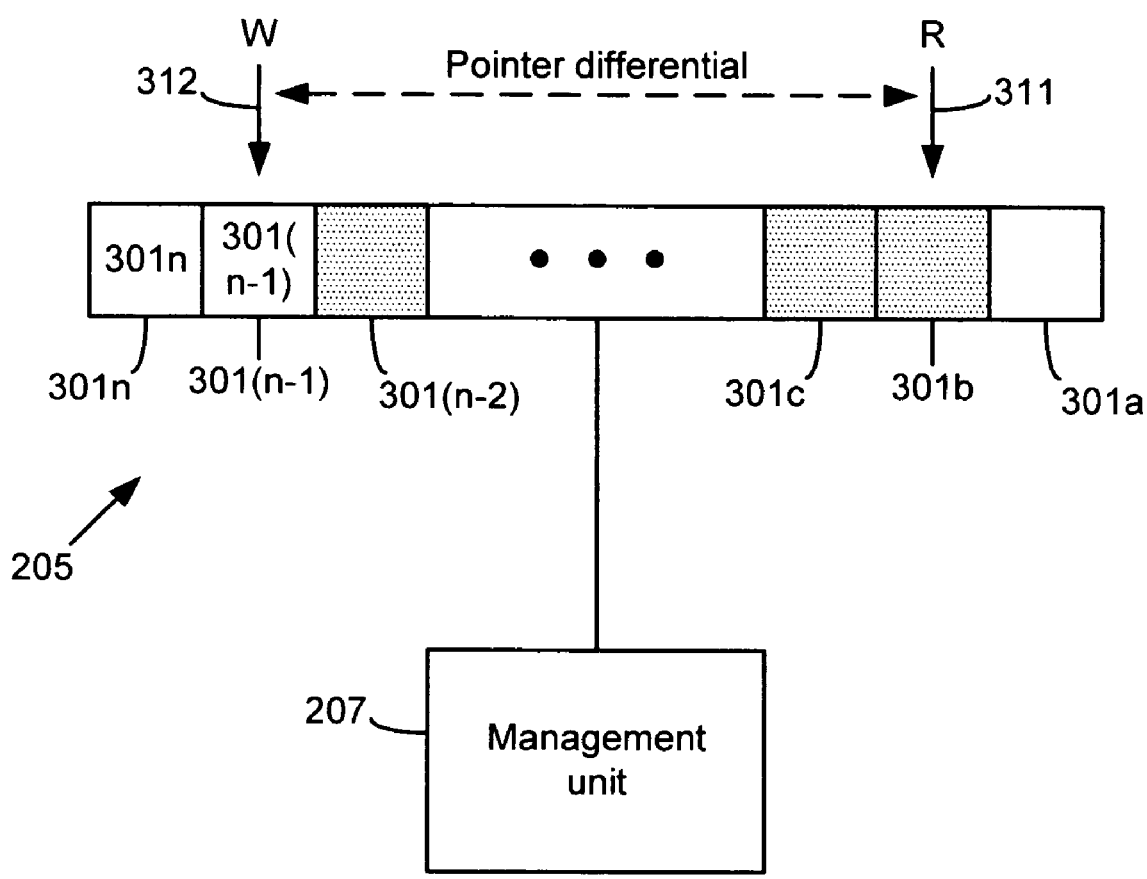
FIG. 3 is a diagram illustrating an input buffer and a corresponding management unit in accordance with one embodiment of the invention.

Referring to FIG. 3, a diagram illustrating input buffer 205 and management unit 207 in more detail is shown. As depicted in this figure, input buffer 205 has n storage locations 301. Input buffer 205 also has a pair of pointers, 311 and 312, associated with it. Pointer 311 is a read pointer, and pointer 312 is a write pointer. Pointers 311 and 312 are managed by buffer management unit 207.

It should be noted that, for the purposes of this disclosure, identical items in the figures may be indicated by identical reference numerals followed by a lowercase letter, e.g., 12a, 12b, and so on. The items may be collectively referred to herein simply by the reference numeral.

As the samples of the input data stream are received by the sample rate converter, they are written to input buffer 205. Each sample is written to the storage locations 301 indicated by write pointer 312 at the time it is written. Each time a sample is written to input buffer 205, write pointer 312 is indexed to the next storage location. For example, if write pointer 312 currently indicates storage location 301n−1 and a sample is received, the sample will be written to storage location 301n−1, and write pointer 312 will be indexed (advanced) to storage location 301n. In this embodiment, input buffer 205 is a first-in-first-out (FIFO) buffer which is circularly accessed. In other words, input buffer 205 wraps around so that a pointer advances from storage location 301 (n−1) to storage location 301n, and then back to storage location 301a.

When a sample is to be read out of input buffer 205, a sample is read out of the storage location indicated by read pointer 311. After the sample is read out of this storage location (301b in the figure), read pointer 311 is indexed to the next storage location (301c in the figure). Read pointer 311 circularly accesses input buffer 205 in the same manner as write pointer 312, advancing from storage location 301(n−1) to storage location 301n, and then back to storage location 301a.

Read pointer 311 typically lags behind write pointer 312 by several storage locations. The exact number generally depends upon the requirements of the particular implementation. In the present systems and methods, it is desired to maintain the pointer differential (the number of storage locations by which read pointer 311 lags behind write pointer 312) at a target level. In other words, it is desired to have a particular number of samples stored in input buffer 205 at any given time. Because the samples are written into and read out of the input buffer at a known rate (the input sample rate), maintaining a desired number of samples in the buffer corresponds to maintaining a desired delay in the buffer.

Any variation from the target differential is considered an error. To compensate for the variations, the error is scaled and applied as a secondary input to low pass filter 240 via feedback unit 270. This error signal offsets the input to low pass filter 240 and causes adjustment of the rate estimation that in turn causes the pointer differential to drift toward the target differential. The secondary feedback loop has very low gain and a corresponding long response time. Nonlinear processing may also be added to dynamically change the bandwidth of the low pass filter as a function of lock time and to re-center the pointers in the event of loss of lock.

The present systems and methods are directed to multi-channel systems. The general structure described in relation to FIGS. 2 and 3 can easily be extended to these multi-channel systems. In this case, each sample rate converter would perform all the same calculations using its own local sample rate estimator, low pass filter, phase accumulator and input buffer. If the units were allowed to operate asynchronously, the long term delay errors between channels would be forced to zero, but the short-term errors could vary from channel to channel, causing the audio image to move.

To compensate for these variations, a single master and multiple slave units are designated. The target differential is fixed for the input buffer of the master sample rate converters, but is variable for the input buffers of the slave sample rate converters. Each of the sample rate converters attempts to drive its pointer differential error to 0 by computing error=write pointer−read pointer−target differential. In the Master the target differential will be a constant. To achieve synchronization and tracking, the target differential in all slaves will be the actual pointer differential from the master. This method provides good tracking while only passing a minimum of data between sample rate converters. The algorithm can also be identical from master to slave, with the exception that the target differential is a constant in the master and a variable in the slaves.

Figure 4:
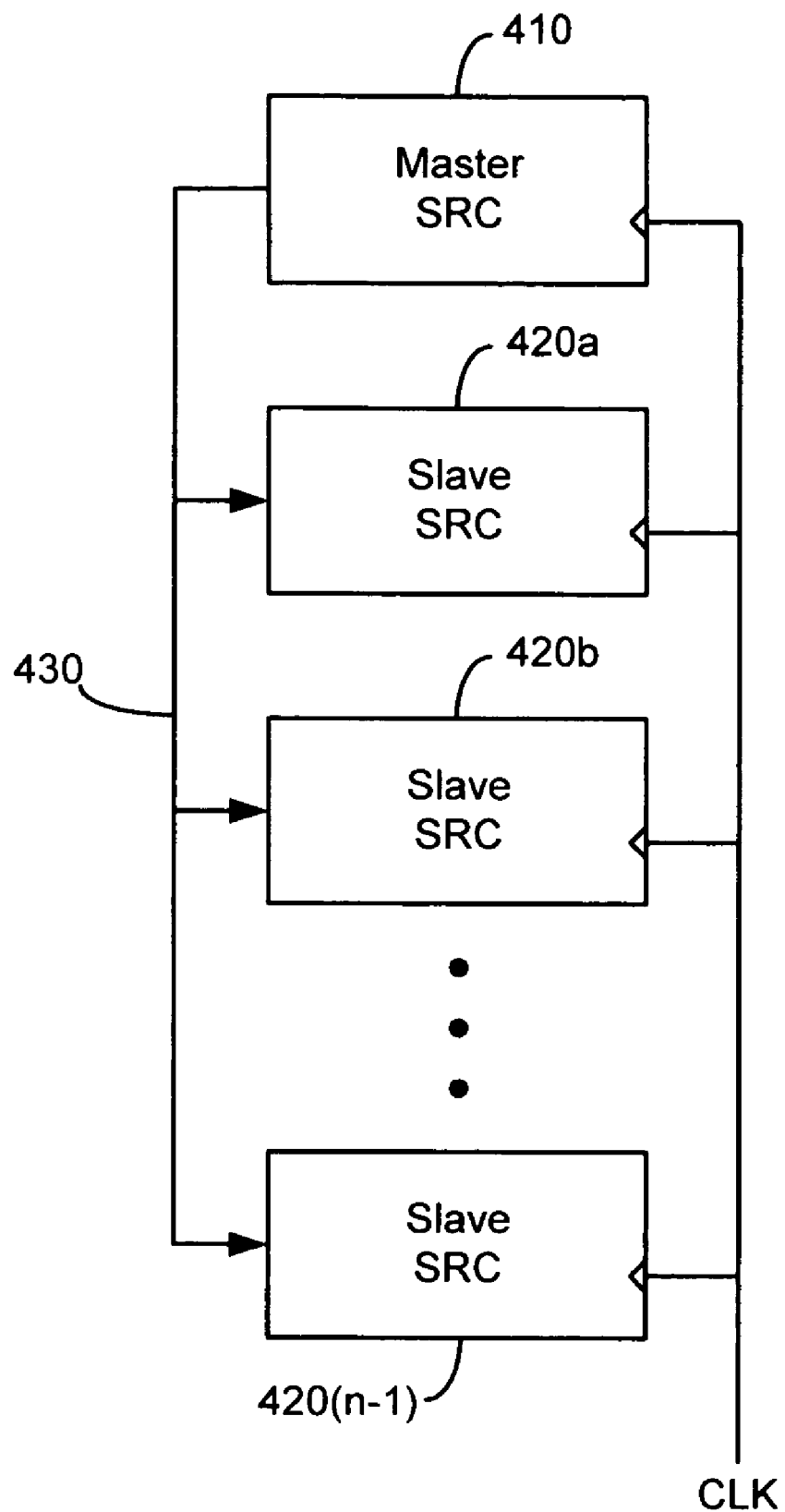
FIG. 4 is a diagram illustrating the master-slave relationship between the sample rate converters in accordance with one embodiment of the invention.

Referring to FIG. 4, a diagram illustrating the master-slave relationship is shown. While the figure depicts four sample rate converters, there may be n sample rate converters corresponding to n channels. One of the sample rate converters, 410, is a master. The remainder of the sample rate converters, 420, are slaves to the master.

The input buffer of master sample rate converter 420 is controlled in such a manner as to drive the actual pointer differential to a predetermined target differential. This predetermined target differential is fixed at a level which is desirable for the particular implementation of the input buffer. Thus, the input buffer of a master sample rate converter is controlled in a way that attempts to maintain a desired number of samples in the buffer.

As noted above, it is desired to maintain the phase alignment of audio signal samples received by each of the sample rate converters. The phase alignment can be maintained by synchronizing the sample rate converters and ensuring that, as samples are received by each of the sample rate converters, samples that are received at the same time experience the same delay in the respective input buffers. If the slave sample rate converters attempted to track the same target differential as the master sample rate converter, variations in the respective sample rates, rate estimates and other such factors would cause corresponding variations in the rates at which samples were read out of the respective input buffers. Misalignment of the phases of the respective channels' signals could result from these variations.

Therefore, rather than having each of the sample rate converters track the same target pointer differential, only the master sample rate converter tracks the predetermined target differential. The slave sample rate converters than track the actual pointer differential of the master sample rate converter. Thus, corresponding samples in each of the sample rate converters are read out of the respective input buffers at the same time (maintaining the phase alignment) and, because the master is already tracking the predetermined target differential, the slaves are indirectly tracking this same target.

Figure 5:
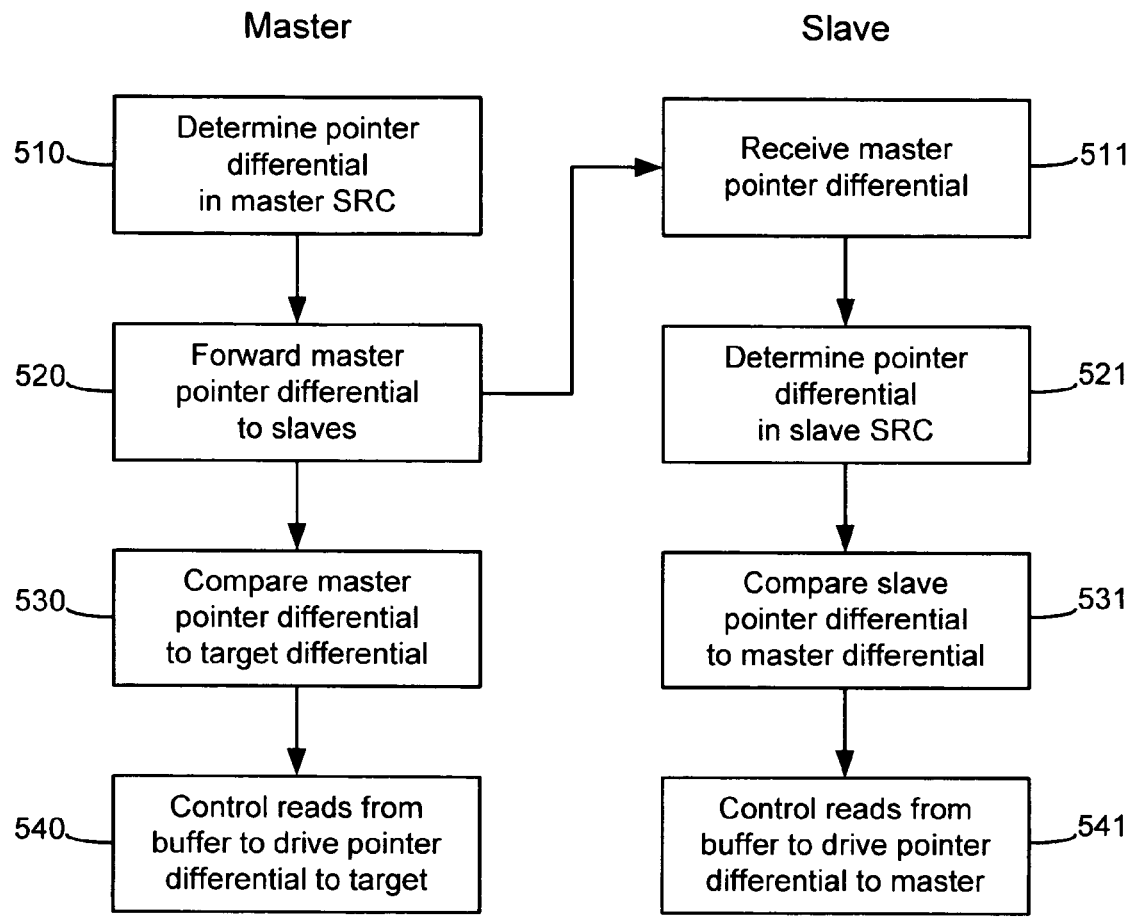
FIG. 5 is a flow diagram illustrating the operation of the master and slave sample rate converters in accordance with one embodiment of the invention.

Referring to FIG. 5, a flow diagram illustrating the operation of the master and slave sample rate converters is shown. The steps involved in the operation of the master sample rate converter are shown on the left side of the figure, while the steps involved in the operation of the slave sample rate converters are shown on the right side of the figure.

Referring to the left side of FIG. 5, the master sample rate converter first determines the actual differential between the read and write pointers of its input buffer (510). This differential is then forwarded by the master sample rate converter to each of the slave sample rate converters (520). The master sample rate converter than compares the actual differential between the pointers to a predetermined target differential (530). The results of the comparison are used to control reads of samples from the input buffer and to thereby drive the actual differential toward the target differential (540). In other words, if the actual, measured differential between the read and write pointers is greater than the target differential, samples will be read from the buffer at a higher rate (at least temporarily). If, on the other hand, the actual pointer differential is less than the target differential, samples will (at least temporarily) be read from the buffer at a lower rate.

Referring to the right side of FIG. 5, each slave sample rate converter receives the actual, measured pointer differential of the master sample rate converter (511). The slave sample rate converter also determines the differential between the read and write pointers of its own input buffer (521). The slave sample rate converter then compares its own measured pointer differential to the pointer differential of the master sample rate converter (531). The comparison of the actual pointer differentials of the slave and master sample rate converters is then used to control reads from the input buffer of the slave sample rate converter and to thereby drive the pointer differential of the slave to the pointer differential of the master (541).

This same process is carried on in each of the slave sample rate converters. Each slave sample rate converter thereby drives its own pointer differential to the pointer differential of the master sample rate converter. Consequently, the input buffer delays of all of the slave sample rate converters are driven to have the same delay as the master sample rate converter, and the phase alignment of the audio signals is maintained. This is true regardless of whether or not the master pointer differential matches the predetermined target differential to which the master sample rate converter drives its own pointer differential. It should also be noted that the same general algorithm (i.e., comparing an actual pointer differential to a target differential and controlling reads from the input buffer accordingly) can be used in both the master and slave sample rate converters. The only difference between the implementation of the algorithm in the master and the slaves is that the target differential for the master is a predetermined value, while the target differential for the slaves is a variable (i.e., the actual differential of the master).

It should be noted in regard to the methods described above for operation of the sample rate converters that the identified steps need not be taken in the exact order in which they are presented in this particular embodiment. For example, the slave sample rate converters may determine their own pointer differentials before receiving the master pointer differential, instead of the other way around. Other variations of this type are also possible.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention.

What is claimed is:

1. A multi-channel audio amplifier system comprising:
a plurality of audio amplifier channels, wherein each channel includes
a sample rate converter configured to receive samples of an input audio data stream, store the samples in an input buffer, retrieve samples from the input buffer, and convert the samples to a re-sampled audio data stream, and
a buffer management unit coupled to the input buffer and configured to maintain a write pointer indicating a position in the input buffer to which a next sample will be written and a read pointer indicating a position in the input buffer from which a next sample will be read, wherein the buffer management unit is configured to determine an actual difference between the values of the read and write pointers, wherein the buffer management unit is further configured to control a rate at which samples are read from the input buffer to achieve a target difference between the values of the read and write pointers;
wherein for a first one of the channels, the target difference comprises a predetermined value; and
wherein for the remainder of the channels, the target difference comprises the actual difference between the values of the read and write pointers of the first one of the channels.

2. The system of claim 1, further comprising an interconnect between the sample rate converter of the first one of the channels and the sample rate converters of the remainder of the channels, wherein the interconnect conveys the actual difference between the values of the read and write pointers of the first one of the channels to the remainder of the channels.

3. The system of claim 1, wherein:
the target difference for the first one of the channels is constant; and
the target difference for the remainder of the channels is variable.

4. The system of claim 1, wherein for each channel the buffer management unit is configured to read samples from the input buffer without dropping or duplicating any of the samples stored in the input buffer.

5. A multi-channel audio amplifier system comprising:
a plurality of audio amplifier channels, wherein each channel includes
a sample rate converter configured to receive samples of an input audio data stream, store the samples in an input buffer, retrieve samples from the input buffer, and convert the samples to a re-sampled audio data stream,
a buffer management unit coupled to the input buffer and configured to maintain a write pointer indicating a position in the input buffer to which a next sample will be written and a read pointer indicating a position in the input buffer from which a next sample will be read, wherein the buffer management unit is configured to determine an actual difference between the values of the read and write pointers, wherein the buffer management unit is further configured to control a rate at which samples are read from the input buffer to achieve a target difference between the values of the read and write pointers, and a phase selection unit coupled to the buffer management unit, wherein a phase output signal of the phase selection unit is transmitted to the buffer management unit and wherein the phase output signal controls reads from the input buffer;

wherein for a first one of the channels, the target difference comprises a predetermined value; and wherein for the remainder of the channels, the target difference comprises the actual difference between the values of the read and write pointers of the first one of the channels.

6. The system of claim 5, wherein for each channel the sample rate converter further comprises a rate estimator counter, wherein the rate estimator counter is configured to provide a sample rate count to a low pass filter, wherein the low pass filter is configured to filter the sample rate count and to provide the filtered sample rate count to the phase selection unit, and wherein the phase selection unit is configured to generate the phase output signal based upon the filtered sample rate count.

7. A multi-channel audio amplifier system comprising:
a plurality of audio amplifier channels, wherein each channel includes
a sample rate converter configured to receive samples of an input audio data stream, store the samples in an input buffer, retrieve samples from the input buffer, and convert the samples to a re-sampled audio data stream, and
a buffer management unit coupled to the input buffer and configured to maintain a write pointer indicating a position in the input buffer to which a next sample will be written and a read pointer indicating a position in the input buffer from which a next sample will be read, wherein the buffer management unit is configured to determine an actual difference between the values of the read and write pointers, wherein the buffer management unit is further configured to control a rate at which samples are read from the input buffer to achieve a target difference between the values of the read and write pointers;

wherein for a first one of the channels, the target difference comprises a predetermined value;

wherein for the remainder of the channels, the target difference comprises the actual difference between the values of the read and write pointers of the first one of the channels;

wherein for each channel the sample rate converter further comprises a phase selection unit coupled to the buffer management unit, wherein a phase output signal of the phase selection unit is transmitted to the buffer management unit and wherein the phase output signal controls reads from the input buffer;

wherein for each channel the sample rate converter further comprises a rate estimator counter, wherein the rate estimator counter is configured to provide a sample rate count to a low pass filter, wherein the low pass filter is configured to filter the sample rate count and to provide the filtered sample rate count to the phase selection unit, and wherein the phase selection unit is configured to generate the phase output signal based upon the filtered sample rate count; and wherein for each channel the buffer management unit is configured to transmit an error signal to the low pass filter and wherein the low pass filter is configured to use the error signal as an offset to the sample rate count.

8. The system of claim 7, wherein for each channel the sample rate converter further comprises a polyphase coefficient interpolator configured to receive the phase output signal from the phase selection unit and to generate a set of interpolated filter coefficients based on the phase output signal.

9. The system of claim 7, wherein for each channel the sample rate converter further comprises a convolution unit configured to receive samples from the input buffer and sets of filter coefficients from the polyphase coefficient interpolator and to convolve the samples with the sets of filter coefficients.

10. The system of claim 7, wherein:
the target difference for the first one of the channels is constant; and
the target difference for the remainder of the channels is variable.

11. The system of claim 7, wherein for each channel the buffer management unit is configured to read samples from the input buffer without dropping or duplicating any of the samples stored in the input buffer.

12. A method for use with a multi-channel audio amplification system comprising a plurality of audio amplifier channels, the method comprising:
determining a difference between values of a read pointer and a write pointer in each of a plurality of buffers;
controlling a first rate at which samples are read from a first one of the buffers to drive the difference between the corresponding read and write pointers to a predetermined value; and
controlling rates at which samples are read from each of the remaining buffers to drive the difference between the corresponding read and write pointers to the difference between the read and write pointers of the first buffer.

13. The method of claim 12,
wherein each buffer comprises an input buffer in a sample rate converter for one of the plurality of channels; and
wherein the method further comprises, for each channel, writing samples of a corresponding input audio data stream to the buffer, reading samples out of the buffer, convolving the samples with sets of polyphase filter coefficients, and producing samples of an output audio data stream.

14. The method of claim 12, wherein the method is implemented in a plurality of sample rate controllers.

15. The method of claim 14, wherein the buffers comprise input buffers of the sample rate controllers.

16. The method of claim 14, wherein each sample rate controller is implemented in a different channel of the multi-channel audio amplification system.

17. The method of claim 12, further comprising transmitting the difference between the read and write pointers of the first one of the buffers from a buffer management unit associated with the first one of the buffers to buffer management units associated with the remainder of the buffers.

18. The method of claim 12, further comprising, for each channel, reading samples from the buffer without dropping or duplicating any of the samples stored in the buffer.

19. A system comprising:
a plurality of buffers, including a master buffer and one or more slave buffers;

wherein each buffer has a corresponding
- write pointer indicating a position in the buffer to which a next received value will be written,
- read pointer indicating a position in the buffer from which a next output value will be read, and
- controller configured to determine an actual differential between the read and write pointers and to control a corresponding rate at which samples are read from the buffer to achieve a target differential between the read and write pointers;

wherein for the master buffer, the target differential comprises a predetermined value; and wherein for the slave buffers, the target differential comprises the actual differential between the read and write pointers of the buffer.

20. The system of claim 19, wherein:
for the master buffer, the target differential is constant; and
for the slave buffers, the target differential is variable.

21. The system of claim 19, wherein each buffer also has a corresponding buffer management unit configured to read samples from the buffer without dropping or duplicating any of the samples stored in the buffer.

22. A multi-channel audio amplifier system comprising:
a plurality of audio amplifier channels, wherein each channel includes
- a sample rate converter configured to receive samples of an input audio data stream, store the samples in an input buffer, retrieve samples from the input buffer, and convert the samples to a re-sampled audio data stream, and
- a buffer management unit coupled to the input buffer and configured to maintain a write pointer indicating a position in the input buffer to which a next sample will be written and a read pointer indicating a position in the input buffer from which a next sample will be read, wherein the buffer management unit is configured to determine an actual difference between the values of the read and write pointers, wherein the buffer management unit is further configured to control reads from the input buffer to achieve a target difference between the values of the read and write pointers;

wherein for a first one of the channels, the target difference comprises a predetermined value;

wherein for the remainder of the channels, the target difference comprises the actual difference between the values of the read and write pointers of the first one of the channels; and wherein for each channel the sample rate converter includes a phase selection unit coupled to the buffer management unit, wherein a phase output signal of the phase selection unit is transmitted to the buffer management unit and wherein the phase output signal controls reads from the input buffer.

23. The system of claim 22, wherein for each channel the sample rate converter further comprises a rate estimator counter, wherein the rate estimator counter is configured to provide a sample rate count to a low pass filter, wherein the low pass filter is configured to filter the sample rate count and to provide the filtered sample rate count to the phase selection unit, and wherein the phase selection unit is configured to generate the phase output signal based upon the filtered sample rate count.

24. A multi-channel audio amplifier system comprising:
a plurality of audio amplifier channels, wherein each channel includes
- a sample rate converter configured to receive samples of an audio data stream, store the samples in an buffer, retrieve samples from the buffer, and convert the samples to a re-sampled audio data stream, and
- a buffer management unit coupled to the buffer and configured to maintain a write pointer indicating a position in the buffer to which a next sample will be written and a read pointer indicating a position in the buffer from which a next sample will be read, wherein the buffer management unit is configured to determine an actual difference between the values of the read and write pointers, wherein the buffer management unit is further configured to control reads from the buffer to achieve a target difference between the values of the read and write pointers;

wherein for a first one of the channels, the target difference comprises a predetermined value;

wherein for the remainder of the channels, the target difference comprises the actual difference between the values of the read and write pointers of the first one of the channels;

wherein for each channel the sample rate converter includes a phase selection unit coupled to the buffer management unit, wherein a phase output signal of the phase selection unit is transmitted to the buffer management unit and wherein the phase output signal controls reads from the buffer;

wherein for each channel the sample rate converter further comprises a rate estimator counter, wherein the rate estimator counter is configured to provide a sample rate count to a low pass filter, wherein the low pass filter is configured to filter the sample rate count and to provide the filtered sample rate count to the phase selection unit, and wherein the phase selection unit is configured to generate the phase output signal based upon the filtered sample rate count; and wherein for each channel the buffer management unit is configured to transmit an error signal to the low pass filter and wherein the low pass filter is configured to use the error signal as an offset to the sample rate count.

25. The system of claim 24, wherein for each channel the sample rate converter further comprises a polyphase coefficient interpolator configured to receive the phase output signal from the phase selection unit and to generate a set of interpolated filter coefficients based on the phase output signal.

26. The system of claim 24, wherein for each channel the sample rate converter further comprises a convolution unit configured to receive samples from the buffer and sets of filter coefficients from the polyphase coefficient interpolator and to convolve the samples with the sets of filter coefficients.

* * * * *